United States Patent
Gektin et al.

(10) Patent No.: US 6,637,506 B2
(45) Date of Patent: Oct. 28, 2003

(54) MULTI-MATERIAL HEAT SPREADER

(75) Inventors: Vadim Gektin, San Jose, CA (US); Deviprasad Malladi, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/093,643

(22) Filed: Mar. 8, 2002

(65) Prior Publication Data

US 2003/0168203 A1 Sep. 11, 2003

(51) Int. Cl.[7] .................................................. H05K 7/20
(52) U.S. Cl. ........................................ 165/185; 361/705
(58) Field of Search ..................... 165/185; 361/705; 174/16.3

(56) References Cited

U.S. PATENT DOCUMENTS

| | | | | |
|---|---|---|---|---|
| 4,680,618 A | * | 7/1987 | Kuroda et al. ............... | 257/746 |
| 4,914,551 A | * | 4/1990 | Anschel et al. .............. | 361/714 |
| 5,130,771 A | * | 7/1992 | Burnham et al. ............ | 165/905 |
| 5,247,426 A | * | 9/1993 | Hamburgen et al. ........ | 174/16.3 |
| 5,675,474 A | * | 10/1997 | Nagase et al. ............... | 165/185 |
| 6,014,317 A | * | 1/2000 | Sylvester ..................... | 361/760 |
| 6,097,602 A | * | 8/2000 | Witchger ..................... | 361/705 |
| 6,114,048 A | * | 9/2000 | Jech et al. ................... | 228/246 |
| 6,264,882 B1 | * | 7/2001 | Colella et al. .............. | 264/642 |
| 6,288,900 B1 | * | 9/2001 | Johnson et al. ............. | 165/185 |
| 6,292,369 B1 | * | 9/2001 | Daves et al. ................ | 165/185 |
| 6,392,890 B1 | * | 5/2002 | Katchmar .................... | 174/252 |

* cited by examiner

Primary Examiner—Allen Flanigan
(74) Attorney, Agent, or Firm—Blakely Sokoloff Taylor & Zafman, LLP

(57) ABSTRACT

In an embodiment, an apparatus for enhancing a thermal match between portions of a semiconductor device is disclosed. The apparatus includes a die and a heat spreader. The heat spreader is in thermal contact with the die. The heat spreader has a center portion and a perimeter portion. The center portion and the perimeter portions are structurally coupled to each other. In another embodiment, the perimeter portion of the heat spreader is selected from material with a lower CTE than the material for the center portion of the heat spreader.

28 Claims, 3 Drawing Sheets

MULTI-MATERIAL HEAT SPREADER

FIELD OF INVENTION

The present invention generally relates to the field of electronic device manufacturing. More specifically, the present invention relates to utilizing a multi-material heat spreader for enhancing thermal performance of integrated circuit (IC) packages.

BACKGROUND OF INVENTION

As integrated circuit fabrication technology improves, manufacturers are able to integrate additional functionality onto a single silicon substrate. As the number of these functionalities increases, however, so does the number of components on a single chip. Additional components add additional signal switching, in turn, creating more heat.

Heat dissipation is one of the most important challenges facing the semiconductor industry today. It is expected that within a few years, processors may be consuming more than 1,000 Watts of power. Numerous techniques are currently utilized by chip manufacturers to reduce the affects of this problem.

One common way to flush out heat is utilization of heat sinks. Heat sinks are generally pieces of material (often metallic) that pull the generated heat away from a chip. As the heat generated increases, so do the costs associated with providing an adequate heat sink. Another solution is liquid cooling which can be extremely expensive and is generally used for very expensive computer systems (such as super computers).

Other techniques include utilizing software procedures to improve parallelism and slowing down a chip's clock speed. Transmeta Corporation of Santa Clara, Calif., utilizes a software-based approach by replacing transistors with software instead of slowing down a processor. These techniques, however, add overhead for the software procedures invoked and are generally less desirable because of the potential complexity involved.

Another problem created by the additional heat is thermal expansion. Generally, a semiconductor package provides a device with electrical connection to the motherboard, heat dissipation, and mechanical and environmental protection. As part of the mechanical protection function, the package can provide a solution to thermal expansion issues between the semiconductor device and the motherboard, for example.

During normal operation, the semiconductor device is expected to survive a fairly wide range of temperature fluctuations. While undergoing these fluctuations, if the device expands and contracts at one rate while the package and/or board move at vastly different rates, a great deal of stress can be generated within the combined structure. These stresses can produce failures within the components themselves or at any of the interfaces between these components.

Present state-of-the-art in electronic packaging consists of two forms of chip packaging—lidded and lidless (or bare). In a lidded package, a lid serves as a cover for the chip to prevent structural damage and also serves as a mechanism for transferring load forces present above the package to the board. In a lidless design, a bare package force transfer can occur through the die itself and, hence, the magnitude of the force has to be relatively much smaller than the lidded designs to ensure structural integrity of the die.

As for thermal properties, however, use of a bare die has a clear advantage. Namely, in a lidless design the elimination of the lid (which is one of the thermal interfaces) results in a better thermal performance or lower thermal resistance, when compared with a lidded package. Such lower thermal resistance becomes a necessity with an ever-increasing total power dissipation of the electronic packages. To be able to compete thermally with a bare die configuration, lid material needs to have a high thermal conductivity. Often such a material also has a coefficient of thermal expansion (CTE) that is not compatible with the CTE's of the die and substrate material. Making use of such a material may be impractical in certain situations due to a drastic reduction in the package integrity and/or reliability.

SUMMARY OF INVENTION

The present invention includes novel methods and apparatus to enhance thermal performance of IC packages. In an embodiment, an apparatus for enhancing a thermal match between portions of a semiconductor device is disclosed. The apparatus includes a die and a heat spreader. The heat spreader is in thermal contact with the die. The heat spreader has a center portion and a perimeter portion. The center portion and the parameter portions are structurally coupled to each other.

In another embodiment, the perimeter portion of the heat spreader is selected from material with a lower CTE than the material for the center portion of the heat spreader.

In yet another embodiment, the thermal contact between the heat spreader and the die is established through thermal contacts between the perimeter portion of the heat spreader and the die.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment " or "an embodiment" means that a particular feature, structure, or characteristic described in connection with the embodiment is included in at least one embodiment of the invention. The appearances of the phrase "in one embodiment " in various places in the specification are not necessarily all referring to the same embodiment.

Figure 1A:
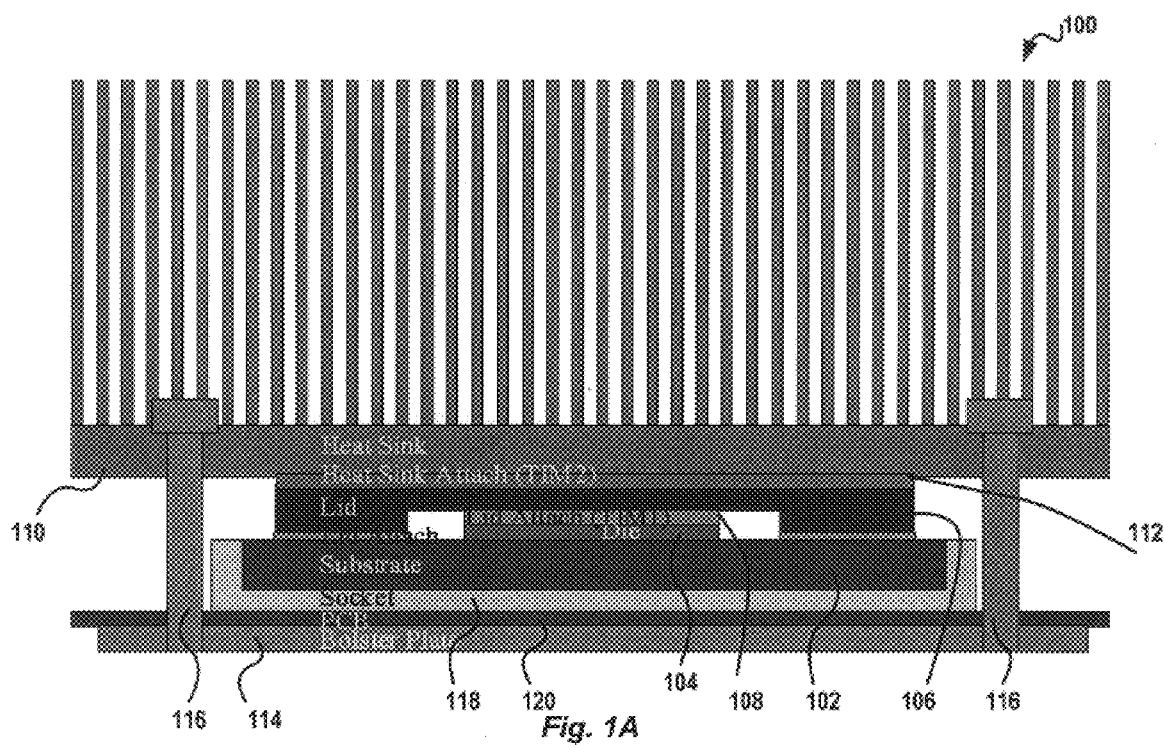
FIG. 1A illustrates an exemplary partial cross-sectional view of a device 100 in accordance with an embodiment of the present invention.

FIG. 1A illustrates an exemplary partial cross-sectional view of a device 100 in accordance with an embodiment of the present invention. A substrate 102 is attached to a die 104. A lid 106 is attached to the die 104 via a lid attach 108 (where TIM1 stands for thermal interface material 1). The lid 106 is attached to a heat sink 110 via a heat sink attach 112 (where TIM2 stands for thermal interface, material 2). The heat sink 110 is envisioned to be constructed using material including copper and/or aluminum with or without vapor chambers or heat pipes, for example, inside of the base, and the like. The heat sink 110 may dissipate heat generated by circuitry present on, for example, the die 104. The heat sink 110 is attached to a bolster plate 114 via connector(s) 116. The bolster plate 114 is envisioned to provide structural support for the device 100. The bolster plate 114 may be attached to a socket 118 via a printed circuit board (PCB) 120. In an embodiment, it is envisioned that socket 118 may hold a package (e.g., including the substrate, die, lid attach, and/or lid). The device 100 may be utilized as a lidded design for any semiconductor device including an integrated circuit, a processor, an application specific integrated chip (ASIC) and the like.

Figure 1B:
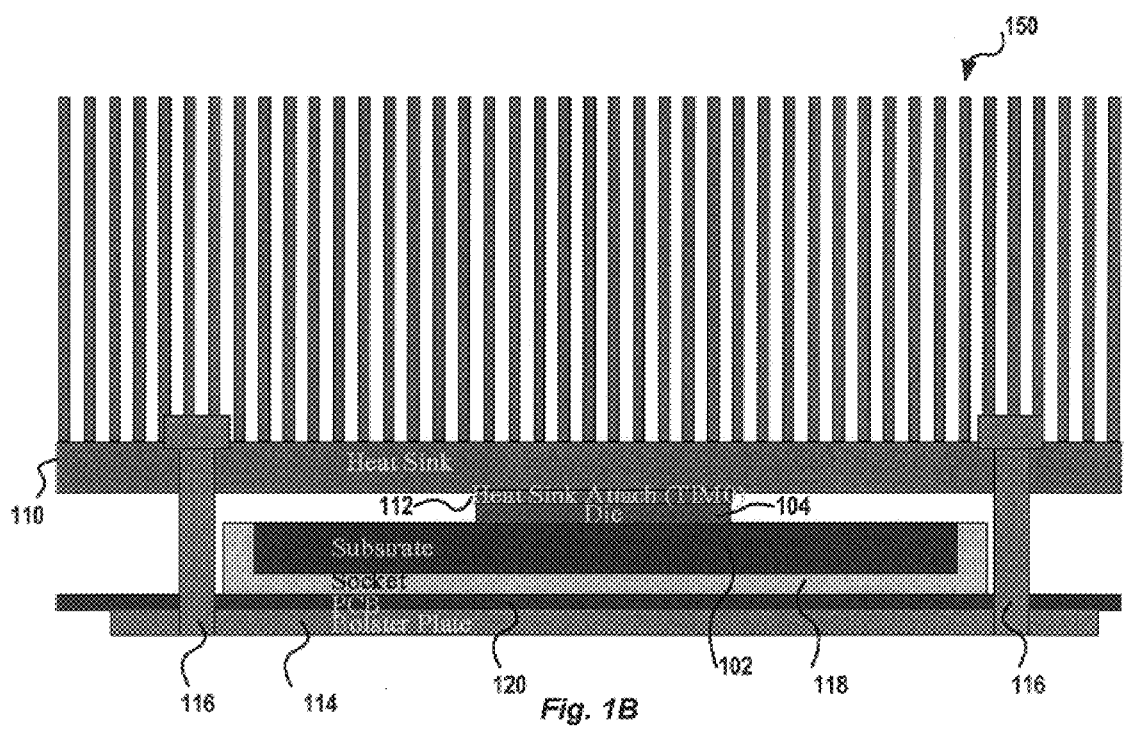
FIG. 1B illustrates an exemplary partial cross-sectional view of a device 150 in accordance with an embodiment of the present invention.

FIG. 1B illustrates an exemplary partial cross-sectional view of a device 150 in accordance with an embodiment of the present invention. A substrate 102 is attached to a die 104. A heat sink 110 is attached to the die 104 via a heat sink attach 112 (where TIM0 stands for thermal interface material 0). The heat sink 110 may dissipate heat generated by circuitry present on, for example, the die 104. The heat sink 110 is attached to a bolster plate 114 via connector(s) 116. The bolster plate 114 is envisioned to provide structural support for the device 150. The bolster plate 114 may be attached to a socket 118 via a printed circuit board (PCB) 120. The socket 118 may be attached to the PCB 120 via solder balls (not shown). In an embodiment, it is envisioned that socket 118 may hold a package (e.g., including the substrate, die, lid attach, and/or lid). The device 150 may be utilized as a lidless design for any semiconductor device including an integrated circuit, a processor, an application specific integrated chip (ASIC) and the like.

Figure 2:
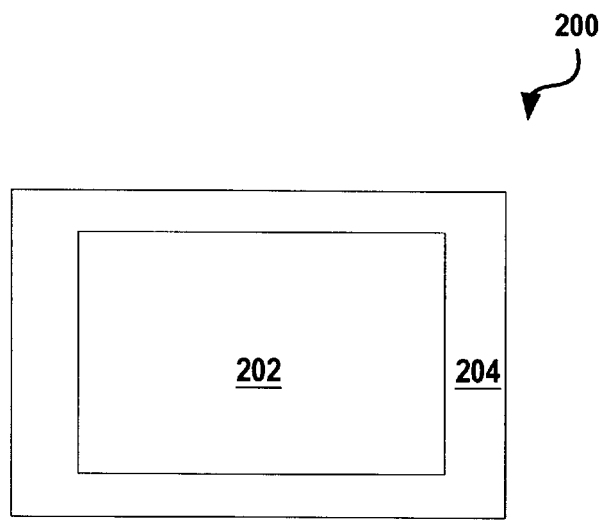
FIG. 2 illustrates an exemplary top view of a device 200 in accordance with an embodiment of the present invention.

FIG. 2 illustrates an exemplary top view of a device 200 in accordance with an embodiment of the present invention. It is envisioned that the device 200 is a multi-material heat spreader including a center portion 202 and a perimeter portion 204. It is envisioned that the coupling between the center portion 202 and the perimeter portion 204 can be press fit or otherwise in form of groves within the perimeters portion 204 and/or the center portion 202, teeth on one or both the center portion 202 and the perimeter portion 204 (the teeth engaging each other), spring loaded coupling links between the center portion 202 and the perimeter portion 204 (wherein the center portion 202 may be movable at its coupling link with the perimeter portion 204, for example). In an embodiment, the device 200 may be a heat spreader disposed between a heat sink (e.g., the heat sink 110 of FIGS. 1A and/or 1B) and a semiconductor device such as the substrate 102 and/or the die 104.

Figure 3:
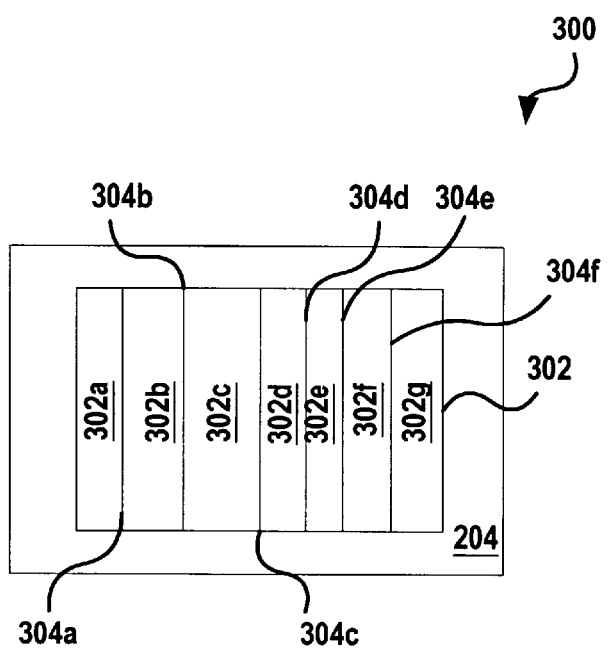
FIG. 3 illustrates an exemplarily top view of a device 300 in accordance with an embodiment of the present invention.

FIG. 3 illustrates an exemplarily top view of a device 300 in accordance with an embodiment of the present invention. It is envisioned that the device 300 is a multi-material heat spreader including a perimeter portion 204 and center portion 302. In an embodiment, the device 300 may be a heat spreader disposed between a heat sink (e.g., the heat sink 110 of FIGS. 1A and/or 1B) and a semiconductor device such as the substrate 102 and/or the die 104. The center portion 302 includes sections 302a–g. As illustrated the sections 302a–g may have differing sizes.

Also these sections may be separated by, for example, dividers 304a–f, which in some embodiments may be selected from the same material as the perimeter portion 204. It is also envisioned that the dividers 304a–f may be in contact with the perimeter portion 204. The device 300 with its dividers in the center portion 302 is envisioned to provide a higher structural integrity for the device 300, in certain embodiments.

It is also envisioned that the dividers 304a–f may be gaps without any material created by spacers (not shown) integrated within the coupling between the center portion 302 and perimeter portion 204. The different sizes of the sections 304a–g are shown to illustrate that, depending on the semiconductor device that the device 300 may be in contact with different sized sections may provide differing thermal behavior. For example, a larger section 302c may be present on a portion of a die wherein less heat removal may be desired. In one embodiment, it is envisioned that the perimeter portion may be in contact with the center portion only at certain points (rather than the shown perimeter around the center portion in FIGS. 2 and 3).

It is additionally envisioned that the perimeter 204 may be in contact with a semiconductor device (such as the substrate 102 and/or the die 104) and/or a semiconductor package (in some embodiments, the perimeter 204 may be even in contact with the bolster plate 114, the PCB 118, and/or the socket 118). It is envisioned that the center portion 202 and the sections 302a–g may be constructed using materials such as copper, silver, gold, aluminum, any combinations thereof, and the like to provide the high thermal conductivity. The perimeter portions 204 are envisioned to be constructed with material including copper-tungsten, tungsten, ceramic, ceramic-like materials, SiC, SiSiC, AlSiC, any combinations thereof, and the like to provide a lower thermal expansion than the material of the center portion 202 and/or the sections 302a–g. As a result, the perimeter portion 204 may assist in limiting the thermal expansion resulting from heat applied to the center portion 202 and/or the sections 302a–g.

Figure 4:
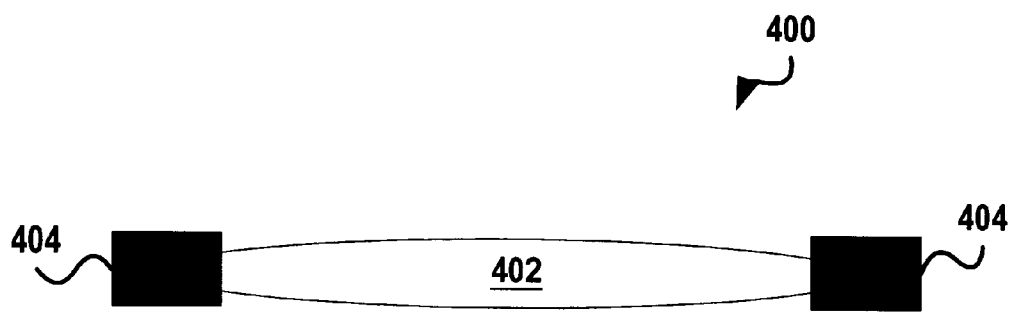
FIG. 4 illustrates an exemplarily partial cross-sectional view of a device 400 in accordance with an embodiment of the present invention.

FIG. 4 illustrates an exemplarily partial cross-sectional view of a device 400 in accordance with an embodiment of the present invention. It is envisioned that the device 400 illustrates the behavior of the center portion 402 after heat is applied to the device 400. It is envisioned that the device 400 is a multi-material heat spreader including a center portion for 402 and one or more perimeter anchors 404. In an embodiment, the device 400 may be a heat spreader disposed between a heat sink (e.g., the heat sink 110 of FIGS. 1A and/or 1B) and a semiconductor device such as the substrate 102 and/or the die 104. In certain embodiments, the center portion 402 may be equivalent to the center portion 202 and/or the sections 302a–g. Similarly, in some embodiments, the perimeter anchors 404 may be associated (e.g., a portion of and/or coupled to) the perimeter portion 204. Moreover, in an embodiment, the perimeter anchors 404 may be constructed with similar material as discussed with respect to the perimeter portion 204.

As illustrated in FIG. 4, the center-portion 402 has expanded vertically whereas the perimeter anchors 404 have limited the lateral expansion of the center portion 402. It is desirable to limit the vertical expansion of the center portion 402 because in certain embodiments the center portion 402 may be in contact with a die and as a result of the thermal expansion shown in FIG. 4, the die may be damaged by the vertical expansion of the center portion 402. It is envisioned that the expansion of the center portion 402 may be matched to the die such that the expansion does not reach a certain threshold resulting in a damaged die.

Figure 5:
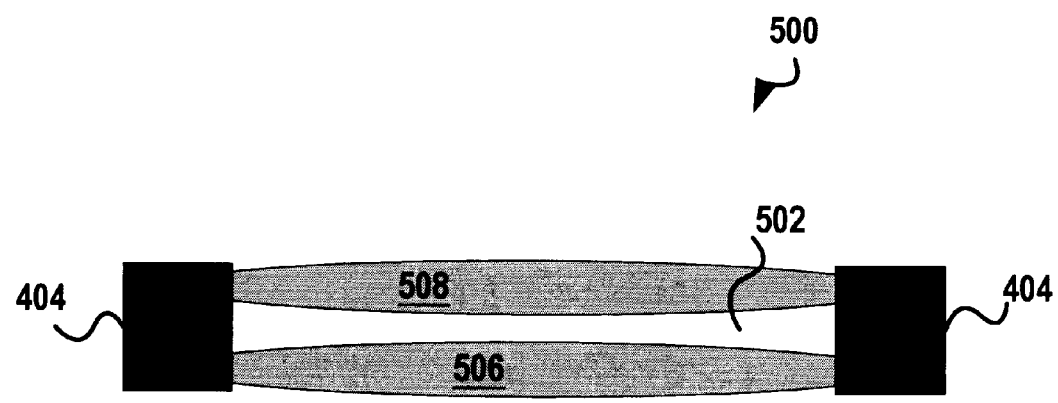
FIG. 5 illustrates an exemplarily partial cross-sectional view of a device 500 in accordance with an embodiment of the present invention.

FIG. 5 illustrates an exemplarily partial cross-sectional view of a device 500 in accordance with an embodiment of the present invention. It is envisioned that the device 500 is a multi-material heat spreader including perimeter anchors 404, a center middle portion 502, and outer center portions 506 and 508. In an embodiment, the device 500 may be a heat spreader disposed between a heat sink (e.g., the heat sink 110 of FIGS. 1A and/or 1B) and a semiconductor device such as the substrate 102 and/or the die 104. In an embodiment, the middle center portion 502 may be similar to the center portion 402, sections 302a–g, and/or center portion 202. Also, the outer center portions 506 and 508 may be constructed of the same material. It is envisioned that the material of the middle center portion 502 and the outer center portions 506 and 508. may be different in some embodiments. For example, to reduce the affects of vertical expansion (e.g., as discussed in reference to FIG. 4), the middle center portion 502 may be constructed with a concave end design (such as illustrated in FIG. 4).

Also, different material may be utilized around the middle center portion 502. For example, the outer center portions 506 and 508 may be constructed with material with a lower CTE than the middle center portion 502. It is envisioned that such a construction may reduce the vertical expansion of device 500 whereby the die may be protected from extraneous physical forces. Even though it is not explicitly shown in FIG. 5, it is envisioned that the outer center portions 506 and 508 may be optional. For example, the side of the center portion 502 which may be proximate to or come into contact with a die may be constructed with an outer center portion (such as 506 if the die is on the underside of the device 500).

In an embodiment, it is envisioned that the construction of the device 500 may be implemented with a differing structure, for example, including sections 302a–g (with or without dividers 304a–f illustrated in FIG. 3). It is further envisioned that the middle center portion of 502 may be constructed utilizing copper whereas the outer center portions 506 and 508 may be constructed with an alloy material having copper and/or tungsten.

Therefore, in accordance with certain embodiments of the present invention, the technical problems associated with the prior art can be overcome with the use of a multi-material heat spreader. The multi-material heat spreader can use a material with a relatively higher thermal conductivity (i.e. a high CTE) in the middle portion of the heat spreader. It is this zone that may affect most of the heat removing capabilities of the package. On the perimeter of the heat spreader, outside of the central zone, a different material(s) with a CTE compatible with the die and/or substrate CTEs can be used. This outside "picture frame" is envisioned not only to provide a CTE match between the heat spreader and the package on the outside, but also constrain the higher CTE material above the die. This last impact also allows use of a more rigid interface connection between the die and the heat spreader, since the relative movement due to the thermal mismatch can be limited by the outside "picture frame" material.

The foregoing description has been directed to specific embodiments. It will be apparent to those with ordinary skill in the art that modifications may be made to the described embodiments, with the attainment of all or some of the advantages. For example, the techniques discussed herein may be applied utilizing a device in place of the multi-material heat spreader discussed herein. Therefore, it is the object of the appended claims to cover all such variations and modifications as come within the spirit and scope of the invention.

What is claimed is:

1. A method of enhancing a thermal match between portions of a semiconductor device, the method comprising:
   providing a die; and
   providing a heat spreader in thermal contact with the die, the heat spreader having a center portion and a perimeter portion, the center portion and the perimeter portions being structurally coupled to each other, the center portion including a plurality of sections;
   wherein the perimeter portion of the heat spreader is selected from material with a lower CTE than the material for the center portion of the heat spreader.

2. The method of claim 1 wherein the thermal contact between the heat spreader and the die is established through thermal contacts between the center portion of the heat spreader and the die.

3. The method of claim 1 wherein the heat spreader and the die are in physical contact.

4. The method of claim 1 wherein the structural coupling between the center portion and the perimeter portion of the heat spreader is provided by a coupling selected from a group comprising grooves, teeth, press fit coupling, and spring-loaded coupling.

5. The method of claim 1 wherein the center portion of the heat spreader is constructed with material selected from a group comprising copper, silver, gold, and aluminum.

6. The method of claim 1 wherein the perimeter portion of the heat spreader is constructed with material selected from a group comprising copper-tungsten, tungsten, ceramic, SiC, SiSiC, and AlSiC.

7. The method of claim 1 wherein the center portion of the heat spreader, is constructed with a first material and a second material, the first material being proximate to the die.

8. The method of claim 7 wherein the first material has a lower CTE than the second material.

9. The method of claim 7 wherein the first and second materials are in thermal contact.

10. The method of claim 7 wherein the first and second materials are in physical contact.

11. The method of claim 1 wherein the plurality of sections are separated with at least one divider.

12. The method of claim 11 wherein the divider is selected from a material with a lower CTE than a material of a rest of the plurality of sections.

13. The method of claim 11 wherein the divider is constructed with a same material as the perimeter portion of the heat spreader.

14. An apparatus for enhancing a thermal match between portions of a semiconductor device, the apparatus comprising:
    a die; and
    a heat spreader in thermal contact with the die, the heat spreader having a center portion and a perimeter portion, the center portion and the perimeter portions being structurally coupled to each other, the center portion including a plurality of sections;
    wherein the perimeter portion of the heat spreader is selected from material with a lower CTE than the material for the center portion of the heat spreader.

15. The apparatus of claim 14 wherein the thermal contact between the heat spreader and the die is established through thermal contacts between the center portion of the heat spreader and the die.

16. The apparatus of claim 14 wherein the heat spreader and the die are in physical contact.

17. The apparatus of claim 14 wherein the structural coupling between the center portion and the perimeter portion of the heat spreader is provided by a coupling selected from a group comprising grooves, teeth, press fit coupling, and spring-loaded coupling.

18. The apparatus of claim 14 wherein the center portion of the heat spreader is constructed with material selected from a group comprising copper, silver, gold, and aluminum.

19. The apparatus of claim 14 wherein the perimeter portion of the heat spreader is constructed with material selected from a group comprising copper-tungsten, tungsten, ceramic, SiC, SiSiC, and AlSiC.

20. The apparatus of claim 14 wherein the center portion of the heat spreader is constructed with a first material and a second material, the first material being proximate to the die.

21. The apparatus of claim 20 wherein the first material has a lower CTE than the second material.

22. The apparatus of claim 20 wherein the first and second materials are in thermal contact.

23. The apparatus of claim 20 wherein the first and second materials are in physical contact.

24. The apparatus of claim 15 wherein the plurality of sections are separated with at least one divider.

25. The apparatus of claim 24 wherein the divider is selected from a material with a lower CTE than a material of a rest of the plurality of sections.

26. The apparatus of claim 24 wherein the divider is constructed with a same material as the perimeter portion of the heat spreader.

27. A apparatus for enhancing a thermal match between portions of a semiconductor device, the apparatus comprising:

a die; and heat spreading means in thermal contact with the die, the heat spreading means having a center portion and a perimeter portion, the center portion and the perimeter portions being structurally coupled to each other, the center portion including a plurality of sections;

wherein the perimeter portion of the heat spreading means is selected from material with a lower CTE than the material for the center portion of the heat spreading means.

28. The apparatus of claim 27 wherein the thermal contact between the heat spreading means and the die is established through thermal contacts between the center portion of the heat spreading means and the die.

* * * * *

UNITED STATES PATENT AND TRADEMARK OFFICE
CERTIFICATE OF CORRECTION

PATENT NO.     : 6,637,506 B2                                            Page 1 of 1
DATED          : October 28, 2003
INVENTOR(S)    : Gektin et al.

It is certified that error appears in the above-identified patent and that said Letters Patent is hereby corrected as shown below:

Columns 6-8,
At the end of claims 1, 14, and 27, please insert the following clause:
-- ; and wherein the plurality of section of said center portion comprises at least one section with a CTE different from another section of said center portion, and different from the CTE of said perimeter portion. --.

Column 8,
Line 1, please delete "claim 15" and insert -- claim 14 --.

Signed and Sealed this

Twenty-seventh Day of January, 2004

JON W. DUDAS
*Acting Director of the United States Patent and Trademark Office*